(12) United States Patent
Austin

(10) Patent No.: US 6,879,654 B2
(45) Date of Patent: Apr. 12, 2005

(54) NON-INTEGER FREQUENCY DIVIDER CIRCUIT

(75) Inventor: John S. Austin, Winooski, VT (US)

(73) Assignee: International Business Machines Corporation, Armonk, NY (US)

( * ) Notice: Subject to any disclaimer, the term of this patent is extended or adjusted under 35 U.S.C. 154(b) by 95 days.

(21) Appl. No.: 10/249,629

(22) Filed: Apr. 25, 2003

(65) Prior Publication Data

US 2004/0213369 A1 Oct. 28, 2004

(51) Int. Cl.[7] ............................................. H03K 21/00
(52) U.S. Cl. ........................... 377/48; 377/34; 377/47; 377/122
(58) Field of Search ........................ 377/48, 47, 34, 377/122

(56) References Cited

U.S. PATENT DOCUMENTS

| 3,566,154 | A | * | 2/1971 | Loessi et al. ............... 377/122 |
| 4,031,476 | A | | 6/1977 | Goldberg .................... 357/220 |
| 4,295,158 | A | | 10/1981 | Nissan et al. ................ 358/17 |
| 4,348,640 | A | * | 9/1982 | Clendening .................. 377/48 |
| 4,477,918 | A | * | 10/1984 | Nossen et al. ............... 377/37 |
| 4,975,931 | A | | 12/1990 | Cosand ........................ 377/52 |
| 5,448,191 | A | | 9/1995 | Meyer ........................ 327/105 |
| 5,774,511 | A | | 6/1998 | Boerstler .................... 375/376 |
| 6,121,801 | A | | 9/2000 | Lee ............................ 327/115 |
| 6,157,694 | A | | 12/2000 | Larsson ...................... 377/48 |

* cited by examiner

*Primary Examiner*—Margaret R. Wambach
(74) *Attorney, Agent, or Firm*—Richard A. Henkler; Dillon & Yudell LLP

(57) ABSTRACT

A non-integer frequency divider is disclosed. The non-integer frequency divider circuit includes several base stages connected to each other. The non-integer frequency divider circuit also includes a clocking circuit for passing an enable bit from one of the base stages to another such that only one of the base stages is enabled at any give time. The enable bit has a pulse width of one clock cycle. The outputs from the base stages are grouped together by an OR gate to generate a single output that is a fraction of an input clock signal.

15 Claims, 3 Drawing Sheets

NON-INTEGER FREQUENCY DIVIDER CIRCUIT

BACKGROUND OF INVENTION

1. Technical Field

The present invention relates to frequency divider circuits in general, and in particular, to non-integer frequency divider circuits. Still more particularly, the present invention relates to a programmable non-integer frequency divider circuit.

2. Description of the Related Art

Frequency divider circuits are commonly employed in electronic devices that include counting circuits, phase-locked loop circuits, and/or frequency synthesizer circuits. Generally speaking, frequency dividers are used to generate signals of relatively lower frequencies by dividing a high frequency signal already existed within an electronic system. For example, if a 50 MHz signal is desired from a 100 MHz clock signal existed within an electronic system, a frequency divider is used to divide the 100 MHz clock signal by two.

Due to the nature of digital logic, the easiest frequency divider circuits to design are those that divide the frequency of an input signal by a factor of $2^n$, where n is an integer. These group of frequency divider circuits can divide an input clock frequency by 2, 4, 8, 16, etc. In other words, these group of frequency divider circuits can produce an output cycle for every 2, 4, 8, 16, etc. input cycles, respectively. More sophisticated frequency divider circuits that are capable of dividing an input signal by all integer values, such as 2, 3, 4, 5, etc., have been developed. But recently, it has become necessary to have frequency divider circuits that is capable of dividing an input signal by non-integer values; that is, ones that can produce an output cycle for every, for example, 2.5 or 3.25 input cycles.

The present disclosure describes a method for constructing a programmable non-integer frequency divider circuit with a desired range and resolution.

SUMMERY OF INVENTION

In accordance with a preferred embodiment of the present invention, a non-integer frequency divider circuit includes several stages connected to each other. The non-integer frequency divider circuit also includes a clocking circuit for passing an enable bit from one of the stages to another such that only one of the stages is enabled at any give time. Preferably, the enable bit has a pulse width of one clock cycle. The outputs from all the stages are grouped together by a logic gate, such as an OR gate, to generate a single output that is a fraction of an input clock signal.

All objects, features, and advantages of the present invention will become apparent in the following detailed written description.

BRIEF DESCRIPTION OF DRAWINGS

The invention itself, as well as a preferred mode of use, further objects, and advantages thereof, will best be understood by reference to the following detailed description of an illustrative embodiment when read in conjunction with the accompanying drawings, wherein.

DETAILED DESCRIPTION

In order to build a frequency divider circuit, the desired range and resolution of the frequency divider circuit are first specified. Range is defined as the maximum achievable divide mode, and resolution is defined as the granularity of the divide mode within the range. For example, the available divide modes for a frequency divider circuit having a range of 2 and a resolution of 0.125 are:

1.000, 1.125, 1.250, 1.375, 1.500, 1.625, 1.750, 1.875, 2.000

As another example, the available divide modes for a frequency divider having a range of 3 and a resolution of 0.25 are:

1.00, 1.25, 1.50, 1.75, 2.00, 2.25, 2.50, 2.75, 3.00

The minimum divide mode is always 1. After the range and resolution have been defined, the number of stages needs to provide the desired resolution is determined, as follows:

number of stages=1/resolution

Next, the number of latches in each stage of the frequency divider circuit is determined, as follows:

number of latches=range

Because each stage requires an input clock; thus, the maximum number of input clocks equals the number of stages, as follows:

number of clocks=number of stages

All the input clocks have the same frequency but need to be phased-spaced from each other, and such phase spacing is equal to the resolution times clock cycle time, as follows:

phase spacing=resolution×clock cycle

Hence, the above-mentioned frequency divider circuit having a range of 2 and a resolution of 0.125, includes:

number of stages=1/0.125=8 number of latches=2 number of clocks=8 phase spacing=0.125 ×clock cycle=⅛ cycle

Similarly, the above-mentioned frequency divider circuit having a range of 3 and a resolution of 0.25, includes:

number of stages=1/0.25=4 number of latches=3 number of clocks =4 phase spacing=0.25×clock cycle=¼ cycle

Although each stage has an input clock, not all of the clocks are needed for every divide mode. In addition, a particular stage may need different clocks for different divide modes. A multiplexer network can be used to steer the input clocks appropriately, and such multiplexer network will be further described in detail.

Figure 1:
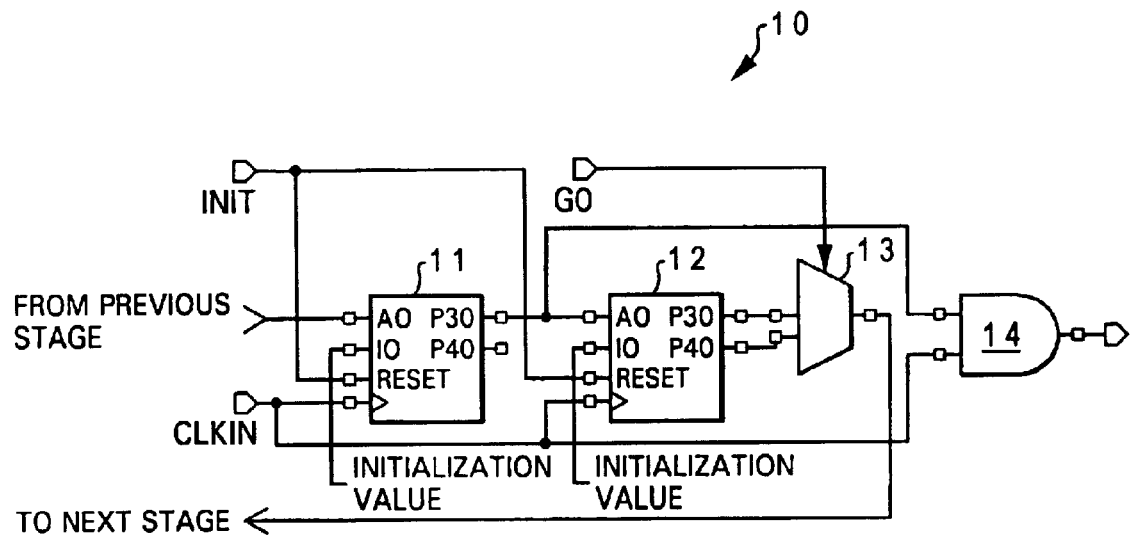
FIG. 1 is a circuit diagram of a stage within a frequency divider circuit, in accordance with a preferred embodiment of the present invention.

Referring now to the drawings, and in particular, to FIG. 1, there is depicted a circuit diagram of a stage for building a frequency divider circuit, in accordance with a preferred embodiment of the present invention. As shown, a stage 10 includes a first latch 11, a second latch 12, a multiplexer 13 and an AND gate 14. First latch 11 and second latch 12 are both clocked by a clock signal CLKIN. An output P30 of first latch 11 is fed to an input A0 of second latch 12. Outputs P30 and P40 of second latch 12 are fed to multiplexer 13. Multiplexer 13 is controlled by a control signal G0. Output P30 of first latch 11 and clock signal CLKIN are fed to AND gate 14.

Figure 2:
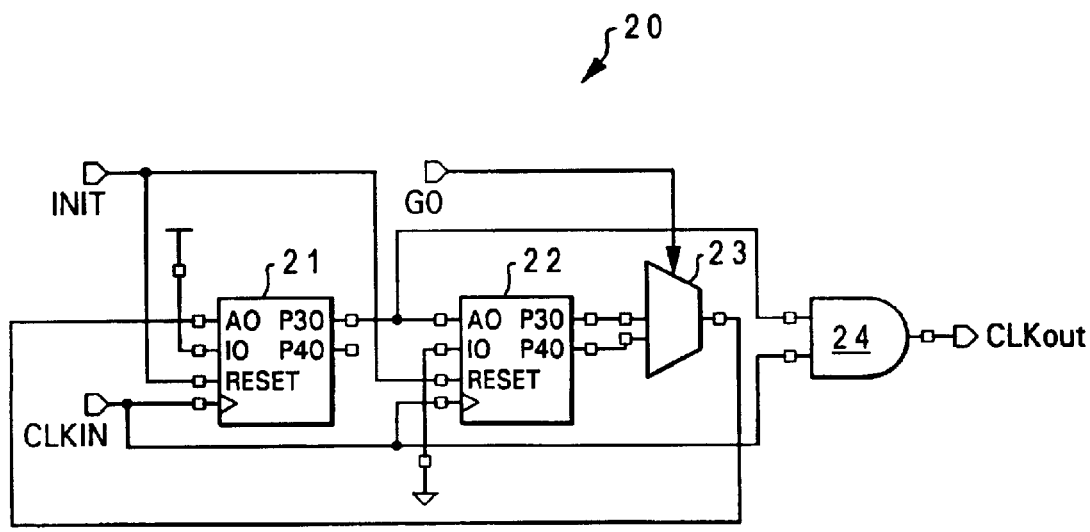
FIG. 2 is a circuit diagram of a frequency divider circuit having only one stage, in accordance with a preferred embodiment of the present invention.

The simplest frequency divider circuit that can be constructed with only one stage, such as stage 10, is by feeding the output of multiplexer 13 back into an input A0 of first latch 11. With reference now to FIG. 2, there is illustrated a circuit diagram of a frequency divider circuit having only one stage, in accordance with a preferred embodiment of the present invention. As shown, a frequency divider circuit 20 includes a first latch 21, a second latch 22, a multiplexer 23 and an AND gate 24. First latch 21 and second latch 22 are both clocked by a clock signal CLKIN. An output P30 of first latch 21 is fed to an input A0 of second latch 22. Outputs P30 and P40 of second latch 22 are fed to multiplexer 23. Multiplexer 23 is controlled by a control signal G0. The output of multiplexer 23 is fed back into an input A0 of first latch 21. Output P30 of first latch 21 and clock signal CLKIN are fed to AND gate 24 to generate a output signal CLKOUT.

Frequency divider circuit 20 operates as follows. When a INIT input is pulsed, first latch 21 and second latch 22 are initialized to the values of the signals at inputs of first latch 21 and second latch 22. In the example shown in FIG. 2, first latch 21 is initialized to a logical high and second latch 22 is initialized to a logical low. When control signal G0 is low, output P30 of second latch 22 is fed back to input A0 of first latch 21, and frequency divider circuit 20 essentially becomes a two-bit shift register. Since one of the bits is initialized high, the outputs of latches 21–22 are high at every other clock cycle CLKIN. Since output P30 of first latch 21 feeds one of the two inputs of AND gate 24, AND gate 24 passes its other input, i.e., clock signal CLKIN, at every other clock cycle CLKIN. As such, output signals CLKOUT of frequency divider circuit 20 is a pulse train having a frequency equal to the frequency of clock signal CLKIN divided by two. Because the width of the pulses of output signal CLKOUT is the same as that of clock signal CLKIN, the duty cycle of output signal CLKOUT is not 50%.

When control signal G0 is high, output P40 of second latch 22 is fed back to input A0 of first latch 21. Output P40 reflects output P30 of first latch 21; thus, when latches 21–22 are loading (versus releasing), the signal at input A0 of first latch 21 passes through to output P40 of second latch 22. Of course, when latches 21–22 are releasing, the data loaded into first latch 21 passes to second latch 22 and out through P30 of second latch 22. In other words, when latches 21–22 are loading, output P30 of first latch 21 passes through output P40 of second latch 22 and back into input A0 of first latch 21. Such configuration essentially functions as a one-bit shift register. Since first latch 21 is initialized high, as mentioned previously, output P30 of first latch 21 is always high and output signal CLKOUT passes every cycle of input clock signal CLKIN. As such, the output signal CLKOUT is the input clock signal CLKIN divided by one.

Figure 3:
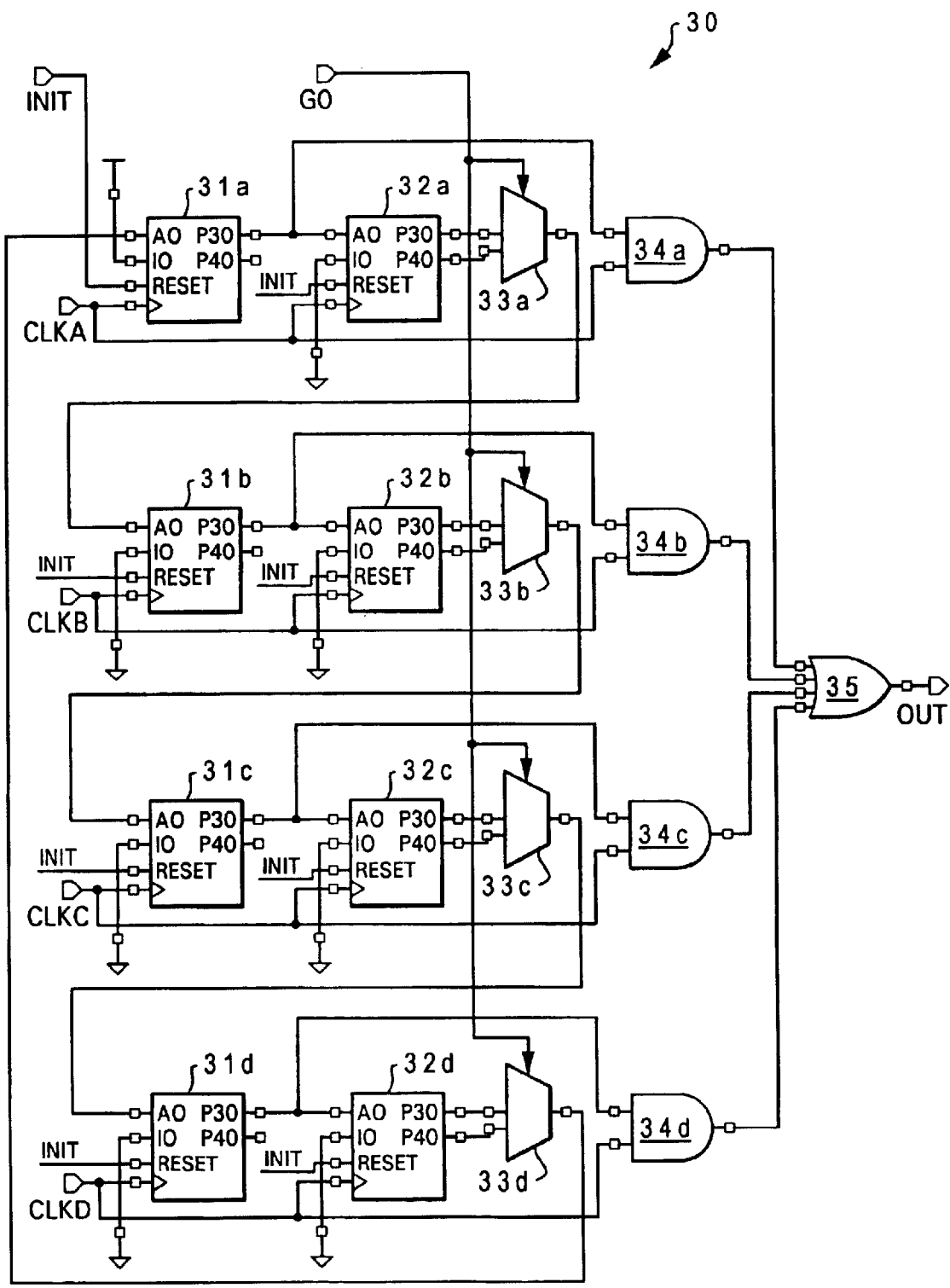
FIG. 3 is a circuit diagram of a non-integer frequency divider circuit having multiple stages, in accordance with a preferred embodiment of the present invention.

In order to build a non-integer frequency divider circuit, several stages are "stitched" together to form a structure that resembles a shift-register. Referring now to FIG. 3, there is depicted a circuit diagram of a non-integer frequency divider circuit having multiple stages, in accordance with a preferred embodiment of the present invention. As shown, a non-integer frequency divider circuit 30 includes four stages—stage 1, stage 2, stage 3 and stage 4. Each stage, which includes a first latch, a second latch, a multiplexer and an AND gate, is substantially identical to stage 10 from FIG. 1. For example, stage 1 includes a first latch 31$a$, a second latch 32$a$, a multiplexer 33$a$ and an AND gate 34$a$; stage 2 includes a first latch 31$b$, a second latch 32$b$, a multiplexer 33$b$ and an AND gate 34$b$; stage 3 includes a first latch 31$c$, a second latch 32$c$, a multiplexer 33$c$ and an AND gate 34$c$; and stage 4 includes a first latch 31$d$, a second latch 32$d$, a multiplexer 33$d$ and an AND gate 34$d$. Stages 1–4 are clocked by CLKA, CLKB, CLKC, CLKD, respectively.

In addition, the output of multiplexer 33$a$ is fed to an input A0 of first latch 31$b$, the output of multiplexer 33$b$ is fed to an input A0 of first latch 31$c$, the output of multiplexer 33$c$ is fed to an input A0 of first latch 31$d$, and the output of multiplexer 33$d$ is fed to an input A0 of first latch 31$a$. Multiplexers 33$a$–33$d$ are commonly controlled by a control signal G0. The outputs from AND gates 34$a$–34$d$ are fed to an OR gate 35 to produce a single output OUT.

During operation, a pulse having a pulse width of one clock cycle is passed from one stage to another within non-integer frequency divider circuit 30. When such a pulse, or more appropriately known as an enable bit, is within a particular stage, it allows one cycle of the corresponding input clock for that stage to pass to the output of that stage. Consider stage 1 of non-integer frequency divider circuit 30. When first latch 31$a$ of stage 1 holds an enable bit and its output is high, AND gate 34$a$ is allowed to pass one cycle of the input clock for stage 1 to the output of stage 1. Second latch 32$a$ is used to delay the transmission of the enable bit to stage 2 by 1 or ½ clock cycle, depending on which side of second latch 32$a$ is passed by multiplexer 33$a$ (via control input G0).

In essence, when the first latch of a stage holds the enable bit, that stage is said to be "enabled" and, as stated, one cycle of the corresponding input clock is passed to the output of that stage. Since the enable bit is only one clock cycle wide, only one stage can be enabled at a time. Thus, at any given time, only one stage is passing an input clock pulse. In other words, at any given time, only one stage outputs a logical high, and the remaining stages output a logical low. As such, the outputs from all the stages (such as outputs from AND gates 34$a$–34$d$) can be combined via OR gate 35. The output of OR gate 35 is a string of pulses, each pulse derived from one of the four stages as determined by the location of the enable bit.

If non-integer frequency divider circuit 30 has a range of 2 and a resolution of 0.25, then 1/0.25=4 input clocks are required, each phase spaced by a quarter (0.25) of a clock cycle. The phase relationships between CLKA, CLKB, CLKC and CLKD vary, depending on the divide value. CLKB can be a quarter cycle ahead of CLKA, a quarter cycle behind, or even have the same phase. The phase relationships between CLKA, CLKB, CLKC and CLKD for each divide value is listed in Table I.

TABLE I

| | divide value | | | | |
|---|---|---|---|---|---|
| | 1 | 1.25 | 1.50 | 1.75 | 2.00 |
| CLKA | 0 | 0 | 0 | 0 | 0 |
| CLKB | 0 | ¼ | ²⁄₄ | ¾ | 0 |

TABLE I-continued

| | divide value | | | | |
|---|---|---|---|---|---|
| | 1 | 1.25 | 1.50 | 1.75 | 2.00 |
| CLKC | 0 | 2/4 | 4/4 (0) | 6/4 (2/4) | 0 |
| CLKD | 0 | 3/4 | 6/4 (2/4) | 9/4 (1/4) | 0 |

In Table I, CLKA is considered the reference clock. The numbers in Table I indicate, for a particular clock, the spacing, in cycles between that clock and CLKA. For a particular divide value, all the clocks are phase spaced by fixed amounts. For the divide-by-1 mode, the phase spacing is zero and all the clocks are in-phase. For the divide-by-1.25 mode, the phase spacing is ¼ of a cycle. For the divide-by-1.5 mode, the phase spacing is 2/4 of a cycle. For each succeeding divide value, the spacing increases by ¼ of a cycle, which is also the resolution of non-integer frequency divider circuit 30.

Figure 4:
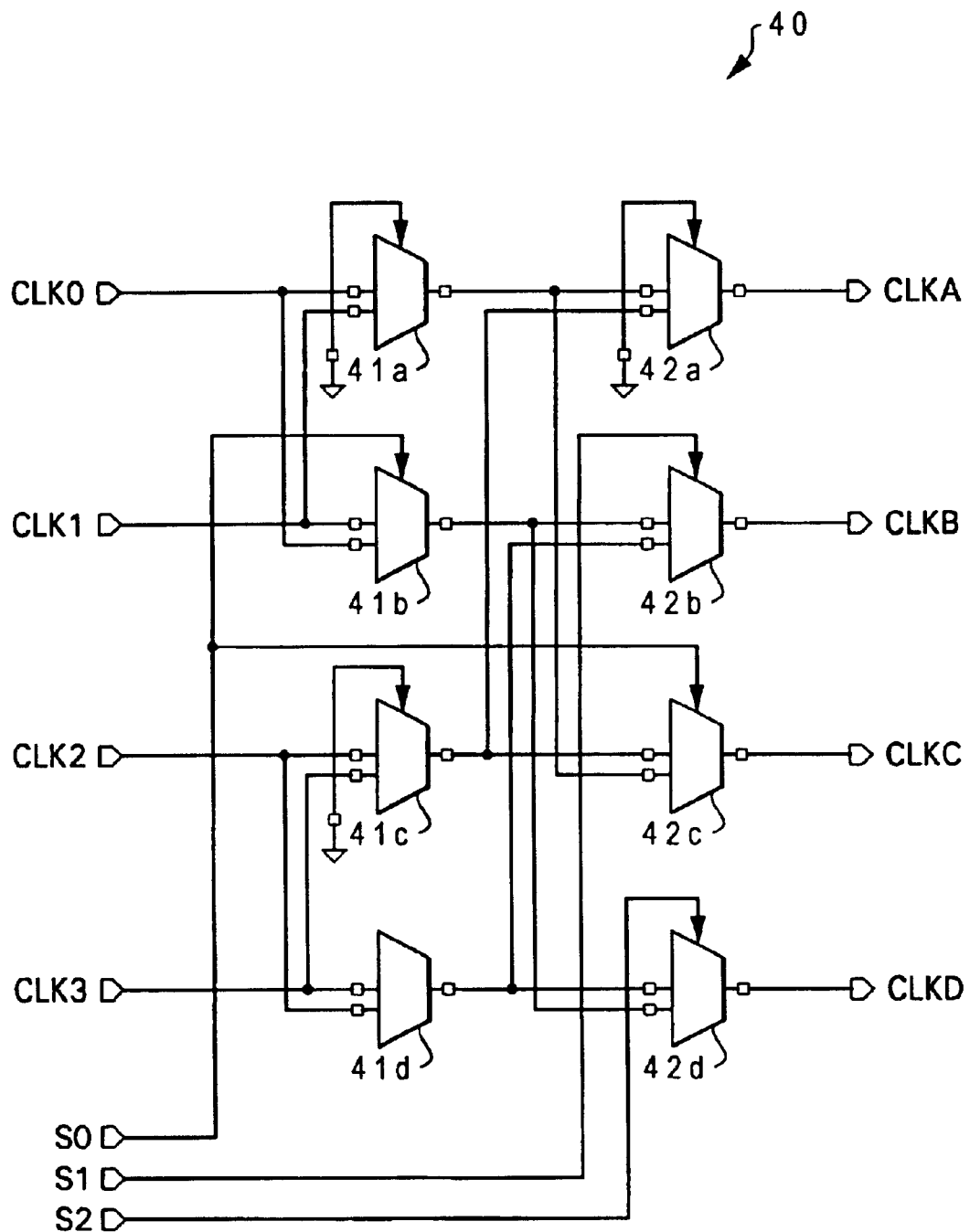
FIG. 4 is a circuit diagram of a clock select circuit for providing proper clocking to the non-integer frequency divide circuit from FIG. 3, in accordance with a preferred embodiment of the present invention.

Appropriate clocks can be utilized to steer the corresponding stages in several ways, but the simplest is to utilize a clock select circuit that outputs the proper clocks based on control inputs that reflect the desired divide mode. FIG. 4 illustrates such a clock select circuit.

With reference now to FIG. 4, there is illustrated a circuit diagram of a clock select circuit for providing proper clocking to non-integer frequency divide circuit 30, in accordance with a preferred embodiment of the present invention. As shown, a clock select circuit 40 includes two levels of multiplexers. The first level includes multiplexers 41a–41d. The second level includes multiplexers 42a–42d. Multiplexers 41a–41d receives clock inputs CLK0, CLK1, CLK2 and CLK3, respectively. CLK1 is phase spaced ¼ of a cycle from CLK0, CLK2 is phased spaced 2/4 of a cycle from CLK0, and CLK3 is phased space ¾ of a cycle from CLK0. Multiplexers 42a–42d outputs clock inputs CLKA, CLKB, CLKC and CLKD, respectively, for non-integer frequency divider circuit 30 (from FIG. 3). Control signal S0 controls multiplexers 41b and 42c. Control signal S1 controls multiplexer 42b. Control signal S2 controls multiplexer 42d. The operations of non-integer frequency divider circuit 30 along with the outputs of clock select circuit 40 are summarized in Table II.

TABLE II

| S0 | S1 | S2 | G0 | CLKA | CLKB | CLKC | CLKD | divide value |
|---|---|---|---|---|---|---|---|---|
| 1 | 0 | 1 | 1 | CLK0 | CLK0 | CLK0 | CLK0 | 1.00 |
| 0 | 0 | 0 | 1 | CLK0 | CLK1 | CLK2 | CLK3 | 1.25 |
| 1 | 1 | 0 | 0 | CLK0 | CLK2 | CLK0 | CLK2 | 1.50 |
| 0 | 1 | 1 | 0 | CLK0 | CLK3 | CLK2 | CLK1 | 1.75 |
| 1 | 0 | 1 | 0 | CLK0 | CLK0 | CLK0 | CLK0 | 2.00 |

As has been described, the present invention provides a method for building a programmable non-integer frequency divider circuit. The programmability refers to the ability of the frequency divider circuit being set, via control inputs, to a desired divide ratio by a user. Such ratio can be integer or non-integer values. A user can set the range and resolution of the divide values simply by adding or subtracting substantially identical stages either in hardware or through gating logic. As with integer-only frequency divider circuits, the divide value of the non-integer frequency divider circuit of the present invention can be increased beyond two by increasing the number of latches in series in each of the stages. For example, a user can set a non-integer frequency divider circuit to a range of 3 and a resolution of 0.25, which allow divide values of 1.00, 1.25, 1.50, 1.75, 2.00, 2.25, 2.50, 2.75, 3.00, by using four stages, each stage having three latches. Similarly, the user can also set a non-integer frequency divider circuit to a range of 4 and a resolution of 0.125, which allow divide values of 1.000, 1.125, 1.250, 1.375, 1.500, 3.625, 3.750, 3.875, 4.000, by using eight stages, each stage having four latches.

While the invention has been particularly shown and described with reference to a preferred embodiment, it will be understood by those skilled in the art that various changes in form and detail may be made therein without departing from the spirit and scope of the invention.

What is claimed is:

1. A frequency divider circuit comprising:
   a plurality of stages connected to each other;
   an input pulse having a pulse width of one clock cycle capable of being passed around said plurality of stages;
   a clocking circuit for passing said input pulse from one of said plurality of stages to another such that only one of said plurality of stages is enabled at any give time; and
   a logic gate for coupling outputs from said plurality of stages to generate an output signal that is a fraction of an input clock signal.

2. The circuit of claim 1, wherein one of said plurality of stages includes a first latch, a second latch, a multiplexer and a logic gate.

3. The circuit of claim 2, wherein said multiplexer is a 2-1 multiplexer and said logic gate is an AND gate.

4. The circuit of claim 1, wherein said plurality of stages are substantially identical with each other.

5. The circuit of claim 1, wherein said plurality of stages are connected to each other in a loop configuration.

6. The circuit of claim 1, wherein the number of clocks in said clocking circuit equals to the number of said plurality of stages.

7. A method for building a frequency divider circuit, said method comprising:
   defining a range and a resolution for said frequency divider circuit;
   determining a number of stages in accordance with said resolution;
   determining a number of latches in accordance with said range;
   determining a number of clocks in accordance with said number of stages;
   connecting said number of stages to each other;
   providing an input pulse having a pulse width of one clock cycle capable of being passed around said stages;
   providing a clocking circuit for passing said input pulse from one of said stages to another such that only one of said stages is enabled at any give time; and
   coupling outputs from said stages to generate an output signal that is a fraction of an input clock signal.

8. The method of claim 7, wherein said number of stages equals 1/(said defined resolution).

9. The method of claim 7, wherein said number of latches equals said defined range.

10. The method of claim 7, wherein said number of clocks equals said determined number of stages.

11. The method of claim 10, wherein a phase spacing between said number of clocks equals resolution×clock cycle.

12. The method of claim 7, wherein one of said of stages includes a first latch, a second latch, a multiplexer and a logic gate.

13. The method of claim 12, wherein said multiplexer is a 2–1 multiplexer and said logic gate is an AND gate.

14. The method of claim 7, wherein said stages are substantially identical with each other.

15. The method of claim 7, wherein said method further includes connecting said stages in a loop configuration.

* * * * *